(12) United States Patent
Letertre et al.

(10) Patent No.: US 7,009,270 B2
(45) Date of Patent: Mar. 7, 2006

(54) SUBSTRATE FOR STRESSED SYSTEMS AND METHOD OF MAKING SAME

(75) Inventors: Fabrice Letertre, Grenoble (FR); Bruno Ghyselen, Seyssinet (FR); Oliver Rayssac, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 87 days.

(21) Appl. No.: 10/755,007

(22) Filed: Jan. 8, 2004

(65) Prior Publication Data

US 2004/0241902 A1 Dec. 2, 2004

(30) Foreign Application Priority Data

May 30, 2003 (FR) .................................. 03 06568

(51) Int. Cl.
    *H01L 29/00* (2006.01)
(52) U.S. Cl. ....................................... 257/496; 257/618
(58) Field of Classification Search ................ 257/798, 257/88, 79, 64, 496, 618; 438/481, 46
    See application file for complete search history.

(56) References Cited

U.S. PATENT DOCUMENTS

| | | | |
|---|---|---|---|
| 4,876,219 A | * | 10/1989 | Eshita et al. ................. 437/126 |
| 5,053,835 A | * | 10/1991 | Horikawa et al. ............. 357/16 |
| 6,121,121 A | * | 9/2000 | Koide ......................... 438/481 |
| 6,570,192 B1 | * | 5/2003 | Davis et al. ................. 257/103 |
| 2002/0025652 A1 | * | 2/2002 | Yanagita et al. ............. 438/406 |
| 2003/0129780 A1 | * | 7/2003 | Auberton-Herve ........... 438/46 |
| 2003/0219959 A1 | * | 11/2003 | Ghyselen et al. ........... 438/458 |

FOREIGN PATENT DOCUMENTS

| | | | |
|---|---|---|---|
| EP | 0 329 400 | * | 8/1989 |
| EP | 0 331 467 | * | 9/1989 |
| EP | 1 178 521 | * | 2/2002 |
| FR | 2 775 121 | * | 8/1999 |
| FR | 2 787 919 | * | 6/2000 |
| WO | WO 99/44224 | * | 9/1999 |
| WO | WO 01/97282 A1 | * | 12/2001 |
| WO | WO 02/43124 A2 | * | 5/2002 |

OTHER PUBLICATIONS

C. P. Chang et al., "A Highly Manufacturable Corner Rounding Solution for O.18μ.m Shallow Trench Isolation", Bell Laboratories, Lucent Technologies, IEDM 97, pp. 661-667 (1997).
K. Sakaguchi et al., "ELTRAN® by Splitting Porous SI Layers", ELTRAN Project, Canon Inc., Electrochemical Society Proceedings, vol. 99, No. 2, pp. 117-121.
A. J. Auberton-Herve et al., "Why Can Smart Cut® Change The Future of Microelectronics?", International Journal of High Speed Electronics and Systems, vol. 10, No. 1 pp131-146 (2000).
Q. Y. Tong et al Extracts of "Semi-conductor on wafer bonding", Science and Technology, Interscience Technology, Wiley Interscience publication, Johnson Wiley & Sons, Inc.

* cited by examiner

*Primary Examiner*—Roy Potter
(74) *Attorney, Agent, or Firm*—Winston & Strawn LLP

(57) ABSTRACT

A stress absorbing microstructure assembly including a support substrate having an accommodation layer that has plurality of motifs engraved or etched in a surface, a buffer layer and a nucleation layer. The stress absorbing microstructure assembly may also include an insulating layer between the buffer layer and the nucleation layer. This assembly can receive thick epitaxial layers thereon with concern of causing cracking of such layers.

27 Claims, 3 Drawing Sheets

SUBSTRATE FOR STRESSED SYSTEMS AND METHOD OF MAKING SAME

FIELD OF INVENTION

The invention relates to a novel substrate having a mechanical stress absorption system. In particular the invention is directed to a support substrate for the deposition of a nucleation layer thereon.

BACKGROUND OF INVENTION

Attempts have been made to produce epitaxial layers from materials such as GaN, GaAs, InP, GaAlAs, InGaAs, AlN, AlGaN, and even SiGe. It is known that relatively thick layers of these materials, for example, layers having a thickness greater than 1 or 2 $\mu$m, are required for good crystalline qualities. The advantages of an epitaxial layer not being stressed (or only slightly stressed), and having a low defect density, i.e., having a dislocation density of less than $10^6/cm^2$ are also known.

Techniques such as MOCVD have been utilized to obtain epitaxial growth of thick layers of GaN, for example, a layer having a thickness greater than 12 $\mu$m on a substrate for epitaxy. The epitaxial growth of such GaN layers has been essentially on the bulk substrates of sapphire, SiC, or Si materials. These three substrates are the most frequently used since they are the most readily available substrates, although a few tests have been carried out on substrates such as ZnO or $LiGaO_2$.

Currently, epitaxial GaN layers homogeneously deposited on a substrate surface have a dislocation density in the range $10^8$ and $10^{10}/cm^2$ regardless of the nucleation surface used. Additionally, the stresses in thick GaN layers obtained by MOCVD (growth temperature 1000–1100° C.) clearly depend on the coefficient of thermal expansion of the epitaxial substrate, which determines the stresses of thermoelastic origin that are imposed on the system.

For example, GaN layers produced on sapphire are in compression, while those obtained on SiC are under slight tension, and those on silicon are under high tension. Tension stresses produce a strong tendency for cracks to form in the epitaxial film, thereby destroying it. The layers subjected to the compression stresses, however, are also problematic.

These problems are particularly true for epitaxial growth on silicon substrates. For silicon epitaxy support, the limit beyond which cracks appear is about 1 $\mu$m to 2 $\mu$m, which is a limiting factor in producing thick, good quality epitaxial layers.

Growth tests on SOI (silicon on insulator) substrates have shown that the use of that type of substrate can reduce the crystal defect density in the epitaxially grown layer because of the compliant nature of the very thin film of silicon present on the oxide. However, that system is limited in its capacity to absorb stresses, in particular for thick GaN layers (like silicon, at best a film thickness of 1 $\mu$m to 2 $\mu$m).

It appears that the crystal quality improves by growth on substrates having motifs. The dislocation densities obtained are of the order of $10^6/cm^2$. Epitaxial lateral overgrowth (ELO) techniques exist, along with techniques known as pendeoepitaxy (PE), lateral overgrowth from trenches (LOFT), and cantilever epitaxy (CE). All of these techniques are based on lateral overgrowth and coalescence of the epitaxially grown layer to ultimately form a continuous film. The continuous films obtained have precise zones with improved crystal quality (the epitaxial lateral overgrowth (ELOG) technique), or have a homogeneous film of crystal quality (LOFT technique). Those solutions have been demonstrated for sapphire, SiC, and Si (111).

Although these solutions improve the crystal quality of the epitaxially grown film, they cannot effectively solve the problem of stress in the epitaxially grown films. Thus, a need exists for a substrate or a support that can absorb high levels of stress during crystal growth, and in particular during thick epitaxial growth of a material. In particular there is a need for a support that absorb stresses when the coefficient of thermal expansion of the epitaxial growth material is different from that of the substrate. The present invention now satisfies that need

SUMMARY OF INVENTION

In one aspect of the invention, a support substrate is provided which has a mechanical stress absorbing system that is capable of absorbing stresses such as those produced by heating or cooling of the substrate. The present invention also relates to a microstructure comprising the novel support substrate, a nucleation or growth layer; and a buffer layer or intermediate layer. Also provided is a method of forming the substrate assembly.

The mechanical stress absorption system of the support substrate is capable of absorbing thermoelastic stresses, such as those generated at the surface of a substrate during temperature changes. The mechanical stress absorbing system comprises an array of stress absorbing elements, which can be obtained by machining the support substrate, e.g. by ion etching. The absorbing element include motifs such as spaced studs, trenches, or saw cuts or any other geometrical motif that has a flexibility or elasticity in a plane that is parallel to the surface of the substrate. During times of stress, the absorbing elements compensate or accommodate such stressed due to its flexibility or elasticity properties.

The microstructure of the invention comprises the support substrate having stress absorbing elements, a nucleation layer, and a buffer or an intermediate layer. The microstructure may further include an oxide layer to form an SOI structure.

Advantageously, the buffer layer of the assembly is also capable of absorbing or accommodating stresses that arise during epitaxial growth of the nucleation or growth layer on the support substrate. Further, the microstructure of the present invention is capable of accommodating epitaxial layers having thicknesses in the order of a few $\mu$m, for example as much as 4 $\mu$m, and in particular thick GaN layers.

The nucleation layer may include by way of example and not limitation, monocrystalline material, such as Si, SiC, GaN, sapphire, AlN or diamond. In one embodiment, the nucleation layer is obtained by transfer from a transfer-substrate.

The support substrate, for example and not limitation, includes Si, or SiC, and the buffer layer includes amorphous silicon, porous silicon, polysilicon, amorphous silicon dioxide $SiO_2$, amorphous silicon nitride $Si_3N_4$, silicon carbide (SiC), gallium nitride (GaN), sapphire or aluminum nitride (AlN).

In a preferred embodiment, the microstructure comprises nucleation layer formed from silicon, a buffer layer that is either polycrystal or porous, a support substrate formed from silicon, and an electrically insulating layer between the nucleation layer and the buffer layer. For example and not limitation, the insulating layer may be an oxide, e.g., silicon oxide, or a boro-phospho-silicate glass layer. Thus, the structure of the invention is compatible with SOI (silicon on insulator) type structures.

In another embodiment, the intermediate layer is formed between the support substrate and the nucleation layer. If the structure is an SOI type structure, the intermediate layer may be formed between the superficial silicon layer and the insulating layer, for example silicon oxide.

In a further embodiment, the nucleation layer and the support substrate is formed from silicon, and an oxide or an electrically insulating layer is located between the nucleation layer and the substrate. This embodiment is therefore also compatible with an SOI type structure.

The buffer layer or intermediate layer may be formed between the nucleation layer or the oxide layer and the support substrate, said buffer layer being porous or polycrystal, for example, for example formed from Si, amorphous silicon, porous silicon, polysilicon, SiC, GaN, sapphire or AlN.

The present invention also provides a method of fabricating a stress absorbing microstructure comprising the steps of implanting atomic species on a transfer substrate to define a plane of weakness so that a portion of the substrate can be easily detached from the transfer substrate. A mechanical stress absorbing system that preferably includes a plurality of motifs are formed in the surface of a support substrate. The transfer substrate having an implanted layer of species is assembled to the support substrate in a face to face orientation. Thereafter, the plane of weakness of the transfer substrate is treated to further weaken the plane of weakness without generating cracking of the transfer substrate. A portion of the transfer substrate is detached from the transfer substrate so that a portion of the transfer substrate remains on the support substrate to form microstructure assembly of the invention. If desired, the assembled transfer substrate and support substrate can be heated to about 1000° C. to reinforce bonding between the transfer substrate and the support substrate and without causing cracking in the transfer or support substrates.

DETAILED DESCRIPTION OF THE PREFERRED EMBODIMENTS

Figure 3A:
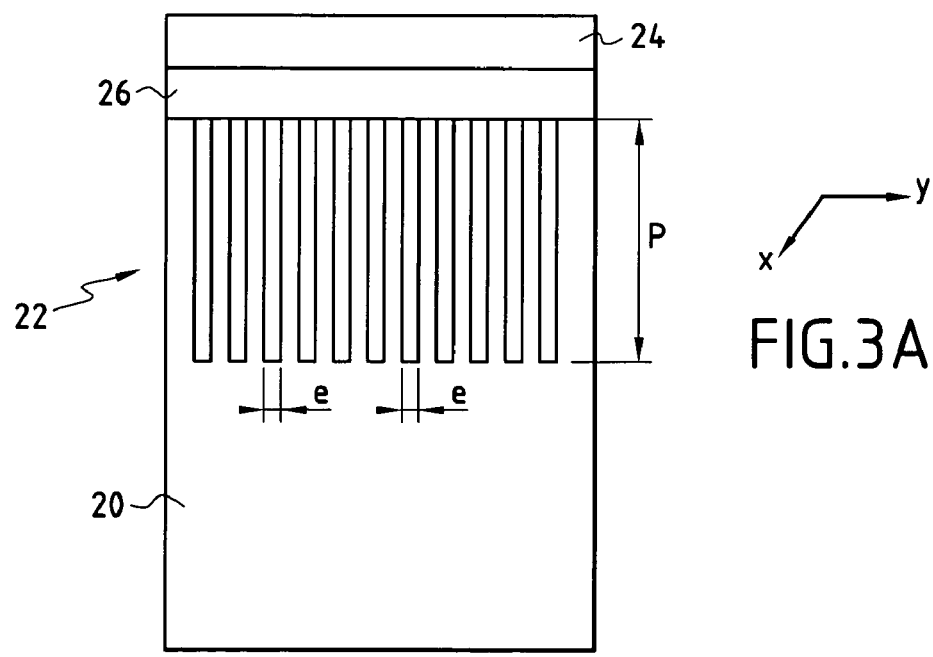
FIG. 3A illustrates a substrate of the invention with a plurality of motifs thereon.

The present invention provides a support substrate having a mechanical stress absorption system. In one aspect of the present invention, and as shown in FIG. 3A, a support substrate 20 or rigid support, is provided with this system as an accommodation layer 22. The accommodation layer is elastic or has a certain degree of elasticity at least in a plane xy, parallel to the plane of layer 24, and layer 26. The accommodation layer 22 comprises at least one motif, such as notches, and/or trenches, both of which may be etched into the substrate layer 20. Alternatively, any other geometric motif that has a stress absorbing effect may be used. Preferably, the at least one motif has an elasticity or flexibility in a plane parallel to the plane of layers 24, 26. As known in the art, the resulting elasticity can be calculated by applying the conventional beam theory.

Figure 3B:
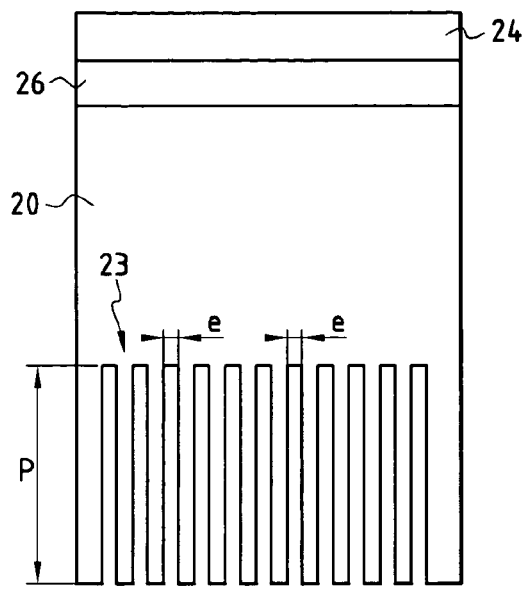
FIG. 3B illustrates a substrate of the invention with a plurality of motifs.

In one embodiment, as shown in FIG. 3B, the accommodation layer 23, is formed at the rear face of substrate 20. Thus, potential difficulties associated with adhering layer 26 and the substrate 20 is minimized.

Advantageously, the embodiments of the present invention are capable of absorbing stresses. Additionally, the two mechanical stress accommodation systems as shown in FIGS. 3A and 3B can be present in the same substrate.

Figure 3C:
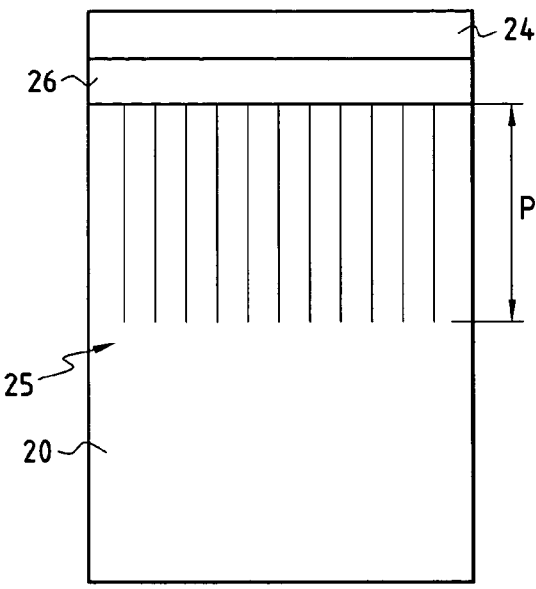
FIG. 3C illustrates a substrate of the invention with notches.

In another embodiment, and as shown in FIG. 3C, motifs in the form of notches 25 such as "saw-cuts," are made in the substrate 20.

In accordance with the invention, the motifs as shown in FIGS. 3A, 3B, and 3C are on at least one side of the substrate of the invention. However, it is also within the present invention to have the motifs such as the notches or trenches illustrated herein on both the front and rear faces of the substrate.

Figure 4:
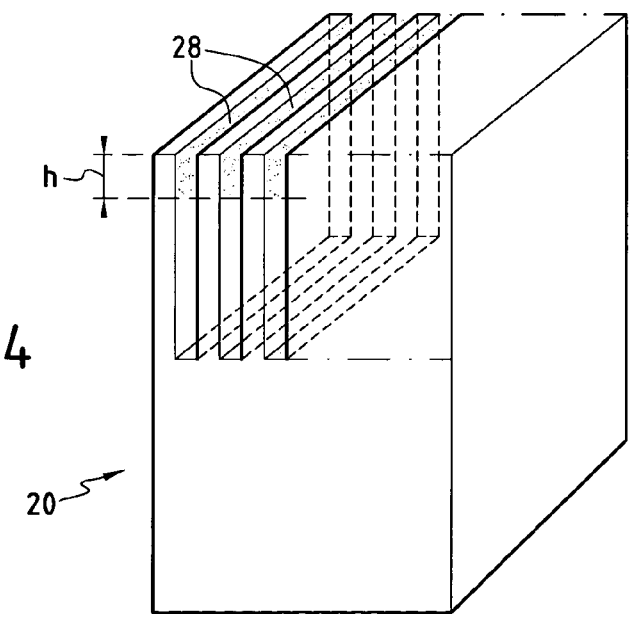
FIG. 4 illustrates a two dimensional pattern of motifs on a substrate.

The etched or hollowed out motifs preferably repeat themselves in a two-dimensional periodic pattern or in one dimension as shown in FIG. 4.

For example and not limitation the trenches have a depth p equal to about 10 $\mu$m, a width l=1 $\mu$m and are spaced apart by an amount of about e=1 $\mu$m. The trenches are hollowed into the substrate 20 to generate a mechanical stress absorption system.

Nucleation layer 24 for example and not limitation may be a layer of monocrystalline material obtained by transferring a thin layer from a first substrate, for example using the "SMART-CUT" method or by fracturing the substrate. Alternatively, the nucleation layer includes silicon, silicon carbide, gallium nitride, sapphire, aluminum nitride or diamond.

Buffer or intermediate layer 26 and the for example, be a polycrystal or porous layer or amorphous layer. For example and not limitation, the buffer layer includes of Si, SiC, GaN, sapphire or AlN or silicon nitride.

Substrate 20 may be for example comprised of silicon, silicon carbide, sapphire, aluminum nitride or diamond.

In another aspect of the present invention, the structure of FIGS. 3A, 3B, or 3C can also be a SOI type structure, wherein layer 26 is an oxide layer or insulator layer and layer 24 is a layer of silicon. For example, with reference to FIG. 2, substrate 16 may be etched so as to form motifs on at least one of the faces parallel to the plane of the layers 10, 12, 14 to form an elastic accommodation layer as described above with reference to FIGS. 3A to 3C. Thereafter the structure may comprise a buffer layer 14, an oxide layer 12, and a thin semiconductor material layer 10.

Support substrate of the present invention that have motifs such as hollowed out trenches or etched notches and the like also have substantially reduced surface areas. Thus, the contact surface area is reduced. Therefore, molecular bonding the substrate to deposited layer may be modified to overcome the reduced contact surface areas. For example, the distribution of the trenches or of the notches could be optimized to allow spontaneous bonding. To this end, the geometric parameters of the patterns could be adjusted, e.g. the width and/or the periodicity of said patterns.

Further, in order to obtain an etched substrate and to be able to preserve a flat bonding surface, it is possible to obturate the surface of the substrate in part or completely prior to bonding. Even complete obturation over the entire depth of the trenches or of the etched patterns enables an absorption effect of the stresses to be conserved.

In one example, if the surface is formed from silicon, a step for smoothing the surface of the substrate 20 in a stream of hydrogen can be carried out to close the etching pits in part or completely by migration of silicon atoms, as illustrated in FIG. 4, in which reference number 28 indicates filling of a trench with silicon over a certain depth h.

In a further example, a non-conforming material (for example an oxide) is deposited to obturate the trenches at the surface. The deposit can be carried out by a non-optimized shallow trench isolation (STI) filling method. Such a method is, for example, described in C. P. Chang et al. "A Highly Manufacturable Corner Rounding Solution for 0.18 μm Shallow Trench Insulation", IEMD 97-661.

Advantageously, the assembled support forms an element that can mechanically absorb stresses by movement and/or deformation of the bars or notches or the walls of the trenches under the effect of the thermoelastic stress.

Figure 1:
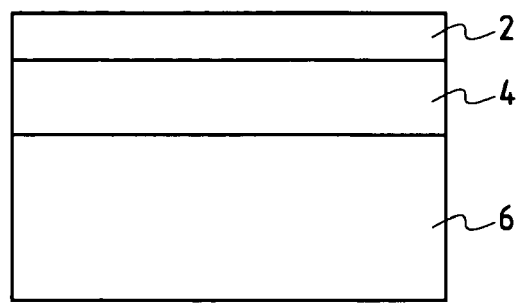
FIG. 1 illustrates a support substrate with a deposited buffer layer and a nucleation layer.

As mentioned above, a buffer or intermediate layer is interposed between a nucleation or growth layer and a substrate. The buffer layer can absorb a quantity of stresses, for example by generating crystalline defects in said layer or by mechanical displacement of material in said layer. FIG. 1 illustrates a nucleation layer 2, buffer layer 4 and a support substrate 6 of the present invention.

The substrate 6 includes Si or SiC or sapphire ($Al_2O_3$) or aluminum nitride (AlN). The buffer layer 4 is a polycrystal, porous, or amorphous layer. It can be formed by CVD techniques and can be formed from silicon (Si), silicon carbide (SiC), gallium nitride (GaN), sapphire or aluminum nitride (AlN), silicon dioxide ($SiO_2$), or silicon nitride $Si_3N_4$. The buffer layer can be a thin layer of amorphous silicon, polysilicon or porous silicon (obtained by intentional porosification or by porous deposit).

Figure 5A:
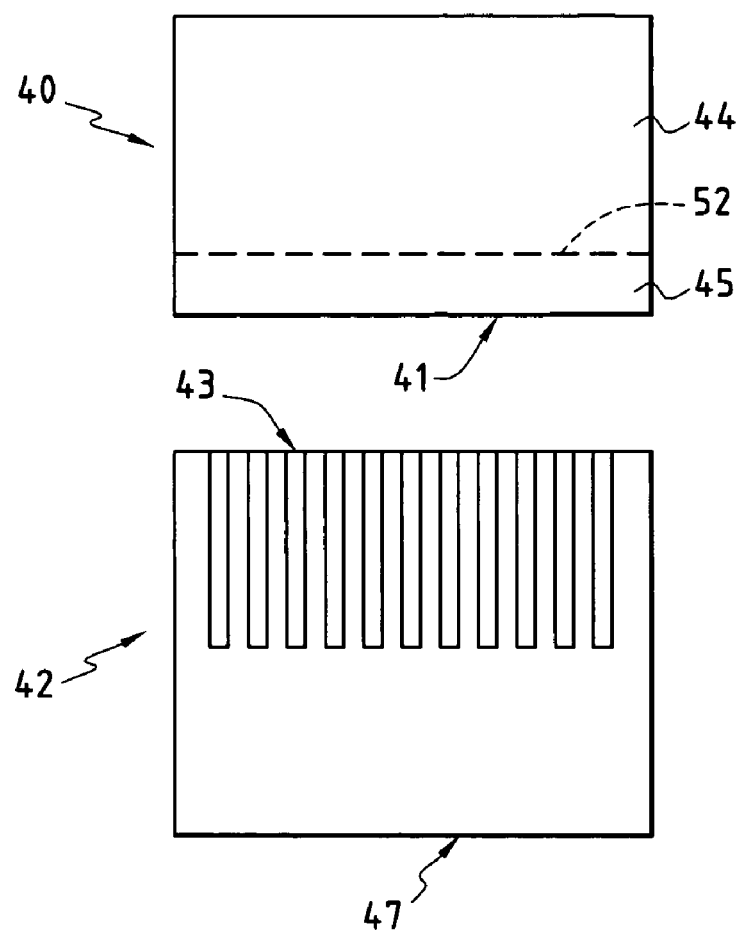
FIG. 5A illustrate a transfer substrate and a support substrate with motifs.
Figure 5B:
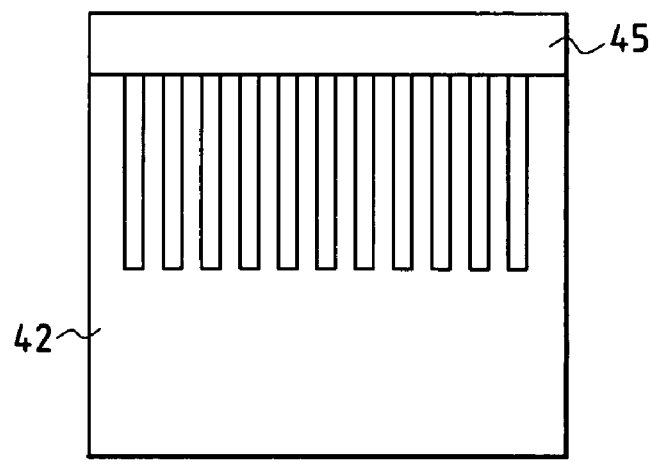
FIG. 5B illustrates the substrate of 5A with deposited transfer substrate from 5A.

The nucleation layer 2 is, for example, a layer of monocrystalline material, obtained by transferring a thin layer from a first substrate, for example using the fracture method known as "SMART-CUT" (see FIGS. 5A and 5B relating to this subject, or even the article by A. J. Auberton-Hervé cited below in this description).

Typically, the thickness of the nucleation layer is of the order of about 0.1 μm to 2 μm thick, for example 0.5 μm; the thickness of the buffer layer is of the order of a few tenths of μm, for example about 0.1 μm to about 1 μm or 2 μm, and the substrate can be of the order of several hundred μm, or in the range 100 μm to 700 μm, for example about 500 μm or 525 μm.

The coefficients of thermal expansion $C_1$ and $C_2$ of the nucleation layer 2 and of the substrate 6 can be different. For example, SiC has a coefficient of thermal expansion of $4.5 \times 10^{-6} K^{-1}$ Si has a coefficient of $2.5 \times 10^{-6} K^{-1}$, alumina ($Al_2O_3$) has a coefficient of $7 \times 10^{-6} K^{-1}$.

This difference in the coefficients of the layer 2 and of the substrate 6 can generate stresses during phases of temperature rise or fall, in particular once the relative difference $|C_1-C_2|/C_1$ or $|C_1-C_2|/C_2$ is at least 10% or 20% or 30% at ambient temperature, i.e. about 20° C. or 25° C.

Stresses generated during an excursion in temperature are absorbed by the buffer layer 4. In the case of a polycrystal layer, the stresses are absorbed therein by defect generation.

In the case of a porous layer, the pores allow local displacement of material which mechanically absorb the tensions or stresses. In the case of an amorphous layer, the privileged relaxation mode of the stresses occurs by creep of the layers present.

Also in accordance with the invention is an SOI type structure in which the oxide becomes viscous at a lower temperature, for example a boro-phospho-silicate glass (BPSG). The viscous layer absorbs the tensions and stresses by creep.

Figure 2:
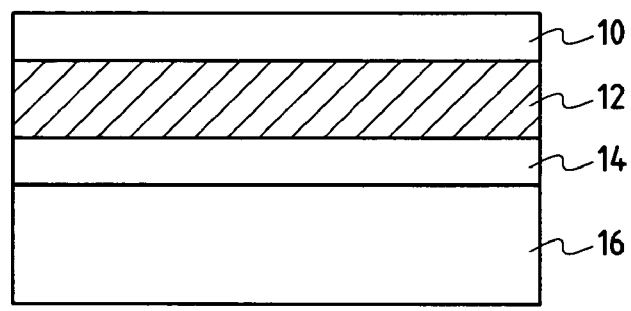
FIG. 2 shows a support substrate with a deposited buffer layer, oxide layer and nucleation layer.

The buffer layer as described above may be interposed in an SOI structure between the oxide or insulating layer and the substrate, as shown in FIG. 2, where 10 designates a thin layer of semiconductive material, preferably monocrystalline, e.g. formed from silicon, silicon carbon SiC, gallium nitride GaN, sapphire, or AlN. Reference number 12 designates a layer of $SiO_2$ oxide, layer 14 represents the buffer layer and reference number 16 represents a substrate formed from a semiconductive material, e.g. thick silicon.

The oxide layer of the SOI structure acts as a stress accommodation layer because the crystal growth methods are carried out at temperatures of the order of several hundred degrees (for example: 1000° C.). At those temperatures, the oxide becomes viscous and absorbs some of the stresses. The buffer layer 14 will also absorb some of said stresses, but in a different manner as it does not become viscous.

The relative difference in the coefficient of thermal expansion between the nucleation layer 10 and the substrate 16 can therefore, likewise, be greater than 10% or 20% or 30% at ambient temperature (20° C. or 25° C.).

For an SOI structure, the buffer layer 14 can, for example, result from a deposit of amorphous or polycrystal silicon that can box in and absorb stresses and is, for example, in the range 10 nm to 1 μm or 0.1 μm to 2 μm thick.

Typically, the thickness of the layer 10, which can be formed by transfer, is about 10 nm to 300 nm, or is even in the range 0.1 μm to 2 μm. The thickness of the layer 12, which can be formed by deposit, is of the order of a few hundred nm, for example in the range 100 nm to 700 nm, for example 400 nm.

The substrate 10 can be of substantially the same thickness as the substrate 6 in FIG. 1.

FIGS. 5A and 5B illustrate a method of preparing the structure of the present invention.

In a first step (FIG. 5A), substrate 40 is implanted with ionic or atomic species to define a thin layer 52 of implanted species which extends substantially parallel to the surface 41 of the substrate 40. A layer or plane of weakness or fracture is formed, defining in the volume of the substrate 40 a lower region 45 intended to constitute a thin film and an upper region 44 constituting the bulk of the substrate 40. Hydrogen is generally implanted, but other species can also be implanted, including co-implantation of hydrogen and helium.

The substrate 42 is provided with motifs such as engraved patterns, for example, as described above. Engraving is performed from the surface 43 and/or from the surface 47.

The two substrates 40 and 42 are then assembled with face 43 against face 41 using a wafer bonding technique (assembling wafers using any technique that is known in the microelectronics field) or by adhesive contact (e.g. molecular adhesion) or by bonding. With regard to these techniques, reference could be made to the work by Q. Y. Tong and U. Gösele, "Semiconductor Wafer Bonding", (Science and Technology), Wiley Interscience Publications.

A portion 44 of the substrate 40 is then removed by a thermal or mechanical treatment that causes a fracture along the plane of weakness 52. An example of that technique is described in the above-mentioned article by A. J. Auberton-Hervé et al. The structure obtained is that shown in FIG. 5B.

In order to reinforce the bonding interface or the join between the substrate 42 (or its face 43) and the thin layer 45 (or the contact face 41), it may be desirable to raise the temperature to about 1000° C.

During the different temperature rise phases, the structure of the motifs etched in the substrate 42, in particular their flexibility or elasticity, compensates for or absorbs the stresses and the varied differences due to differences between the coefficients of the thermal expansion of the two substrates 40, 42. The relative difference between said coefficients can, as already mentioned above, be at least 10% or at least 20% or at least 30% at ambient temperature.

The film 45 can also be a nucleation or growth layer such as the layer 2, 10, or 24 in FIGS. 1 to 3C (the substrate 42 being similar to the substrate 6, 16, 20 in FIGS. 1 to 4). However, unlike those structures, the structure in FIG. 5B does not present a buffer layer.

The film 45 can also be replaced by an assembly of superimposed films. In other words, this aspect of the invention not only concerns a monolayer on substrate system, but any multilayer system that employs layers deposited on a substrate. It is, for example, the association of the nucleation layer and the buffer layer in FIGS. 1 to 3C.

The formation of a plane of weakness can be obtained by methods other than ion implantation. Thus, it is also to make a layer of porous silicon, as described in the article by K. Sataguchi et al. "ELTRAN® by Splitting Porous Si layers", Proceedings of the 9th International Symposium on Silicon-on-Insulator Tech. and Device, 99-3, the Electrochemical Society, Seattle, p.117–121 (1999).

Other techniques also enable the substrates to be thinned without implementing ion implantation and without creating a plane of weakness: such techniques include polishing and etching.

What is claimed is:

1. A support substrate for a microstructure assembly comprising:
   a substrate of a material that is useful in semiconductor applications and that has front and rear faces; and
   a mechanical stress absorbing system associated with the substrate,
   wherein the stress absorbing system is present at least on the rear face of the substrate and absorbs or accommodates stresses caused by epitaxial growth of a crystalline material on the front face of the substrate.

2. The support substrate of claim 1, wherein the mechanical stress absorbing system comprises an accommodation layer has an elasticity that is parallel to the surface of the support substrate, wherein the elasticity of the accommodation layer compensates for thermoplastic stress applied to the substrate.

3. The support substrate of claim 1, wherein the accommodation layer is defined by a plurality of motifs formed in a surface of the substrate.

4. The support substrate of claim 3, wherein the motifs include spaced studs, trenches or saw-cuts.

5. The support substrate of claim 3, wherein the motifs are ion etched into the substrate surface.

6. The support substrate of claim 4, wherein the plurality of motifs are spaced apart by a distance of at least 1 µm.

7. The support substrate of claim 4, wherein the trenches have a depth of about 10 µm and a width of about 1 µm.

8. A stress absorbing microstructure assembly comprising:
   a support substrate;
   a buffer layer deposited on the support substrate;
   a transferred nucleation layer bonded with at least one of the buffer layer and the support substrate, the nucleation layer being transferred by a layer transfer process from a different substrate; and
   a mechanical stress absorbing system associated with the support substrate.

9. The stress absorbing microstructure assembly of claim 8, wherein the mechanical stress absorbing system comprises an accommodation layer that has an elasticity that is parallel to the surface of the support substrate, wherein the elasticity of the accommodation layer compensates for thermoplastic stress applied to the substrate.

10. The stress absorbing microstructure assembly of claim 8, wherein the accommodation layer is defined by a plurality of motifs formed in a surface of the substrate.

11. The stress absorbing microstructure assembly of claim 10, wherein the plurality of motifs is provided by etching at least one surface of the support substrate.

12. The stress absorbing microstructure assembly of claim 10, wherein the plurality of motifs formed in the support substrate includes spaced notches, trenches, or saw cuts.

13. The stress absorbing microstructure assembly of claim 12, wherein the trenches have a depth of about 10 µm, a width of about 1 µm and are spaced by about 1 µm.

14. The stress absorbing microstructure assembly of claim 10, wherein the plurality of motifs are distributed on the surface of the support substrate to optimize spontaneous bonding between the substrate surface and either the buffer layer or the nucleation layer.

15. A stress absorbing microstructure assembly of comprising:
   a support substrate;
   a buffer layer deposited on the support substrate;
   a nucleation layer deposited on at least one of the buffer layer or the support substrate; and
   a mechanical stress absorbing system associated with the substrate, which comprises an accommodation layer that has an elasticity that is parallel to the surface of the support substrate, wherein the elasticity of the accommodation layer compensates for thermoplastic stress applied to the substrate, wherein the accommodation layer is defined by a plurality of motifs formed in a surface of the substrate and at least one of the motifs on the surface of the substrate is obturated with species to provide a smooth bonding surface.

16. The stress absorbing microstructure assembly of claim 8, wherein the nucleation layer comprises a material selected from the group consisting silicon, silicon carbide, gallium nitride, sapphire, aluminum nitride, and diamond.

17. The stress absorbing microstructure assembly of claim 8, wherein the support substrate comprises a material selected from the group consisting of silicon, silicon carbide, sapphire, aluminum nitride, and diamond.

18. The stress absorbing microstructure assembly of claim 8, wherein the buffer layer comprises a material selected from the group consisting of silicon, amorphous silicon, porous silicon, polysilicon, silicon carbide, gallium nitride, sapphire, aluminum nitride, and silicon nitride.

19. The stress absorbing micro structure assembly of claim 8, further comprising an insulating layer.

20. The stress absorbing microstructure assembly of claim 19, wherein the insulating layer is selected from the group consisting of thermal or deposited oxide of silicon, and boro-phospho-silicate glass.

21. The stress absorbing microstructure assembly of claim 8, wherein the nucleation layer has a thickness between about 0.1 $\mu$m to 2 $\mu$m.

22. The stress absorbing microstructure assembly of claim 8, wherein the buffer layer has a thickness of about 0.01 $\mu$m to 2 $\mu$m.

23. The stress absorbing microstructure assembly of claim 8, wherein the nucleation layer has a coefficient of thermal expansion that is different from that of the support substrate.

24. The stress absorbing microstructure assembly of claim 15, wherein the support substrate has front and rear sides and the stress absorbing system is present at least on one side of the support substrate.

25. The stress absorbing microstructure assembly of claim 8, wherein the support substrate has front and rear sides and the stress absorbing system is present at least on one side of the support substrate.

26. The stress absorbing microstructure assembly of claim 25, wherein the stress absorbing system is present on the rear side of the support substrate and includes a plurality of spaced motifs that are in contact with support substrate.

27. The stress absorbing microstructure assembly of claim 25, wherein the stress absorbing system is present on the rear side of the support substrate and includes a plurality of spaced motifs that do not contact the support substrate.

* * * * *

UNITED STATES PATENT AND TRADEMARK OFFICE
CERTIFICATE OF CORRECTION

PATENT NO. : 7,009,270 B2
DATED : March 7, 2006
INVENTOR(S) : Letertre et al.

It is certified that error appears in the above-identified patent and that said Letters Patent is hereby corrected as shown below:

Title Page,
Item [75], Inventors, before "Rayssac", change "Oliver" to -- Olivier --.
Item [56], References Cited, OTHER PUBLICATIONS,
"C.P. Chang et al." reference, change "pp. 661-667" to -- pp. 661-664 --.
"Q.Y. Tong et al." reference, before "Wiley & Sons, Inc." change "Johnson" to
-- John --; and after "Wiley & Sons, Inc.," insert -- pp. 1-15 and 80-99 --.

Column 8,
Line 37, after "A stress absorbing microstructure assembly" delete "of".
Line 54, change "micro structure" to -- microstructure --.

Column 9,
Line 1, change "micro structure" to -- microstructure --.

Signed and Sealed this

Twenty-third Day of May, 2006

JON W. DUDAS
*Director of the United States Patent and Trademark Office*